United States Patent [19]

Corte et al.

[11] 3,944,945

[45] Mar. 16, 1976

[54] NOISE GENERATOR SYSTEM HAVING AMPLITUDE CONTROL

[75] Inventors: Ernesto Corte, La Jolla, Calif.;
Pradeep Maitra, New Delhi, India;
Wesley Donald Franklin, San Diego, Calif.

[73] Assignee: General Atomic Company, San Diego, Calif.

[22] Filed: Nov. 25, 1974

[21] Appl. No.: 526,595

[52] U.S. Cl. .................. 331/78; 330/29; 330/30 D; 330/129; 331/183
[51] Int. Cl.² ........................................ H03B 29/00
[58] Field of Search ........ 331/78, 182, 183; 330/29, 330/30 D, 129

[56] References Cited
UNITED STATES PATENTS

| | | | |
|---|---|---|---|
| 2,671,896 | 3/1954 | DeRosa | 331/78 X |
| 3,028,562 | 4/1962 | Rosen | 331/78 X |

*Primary Examiner*—Siegfried H. Grimm
*Attorney, Agent, or Firm*—Fitch, Even, Tabin & Luedeka

[57] ABSTRACT

A noise generator system is described in which the amplitude of a noise source is stabilized by a feedback loop to an automatic gain control circuit, and wherein the output of the system is time controlled by means of a differential pair amplifier.

6 Claims, 2 Drawing Figures

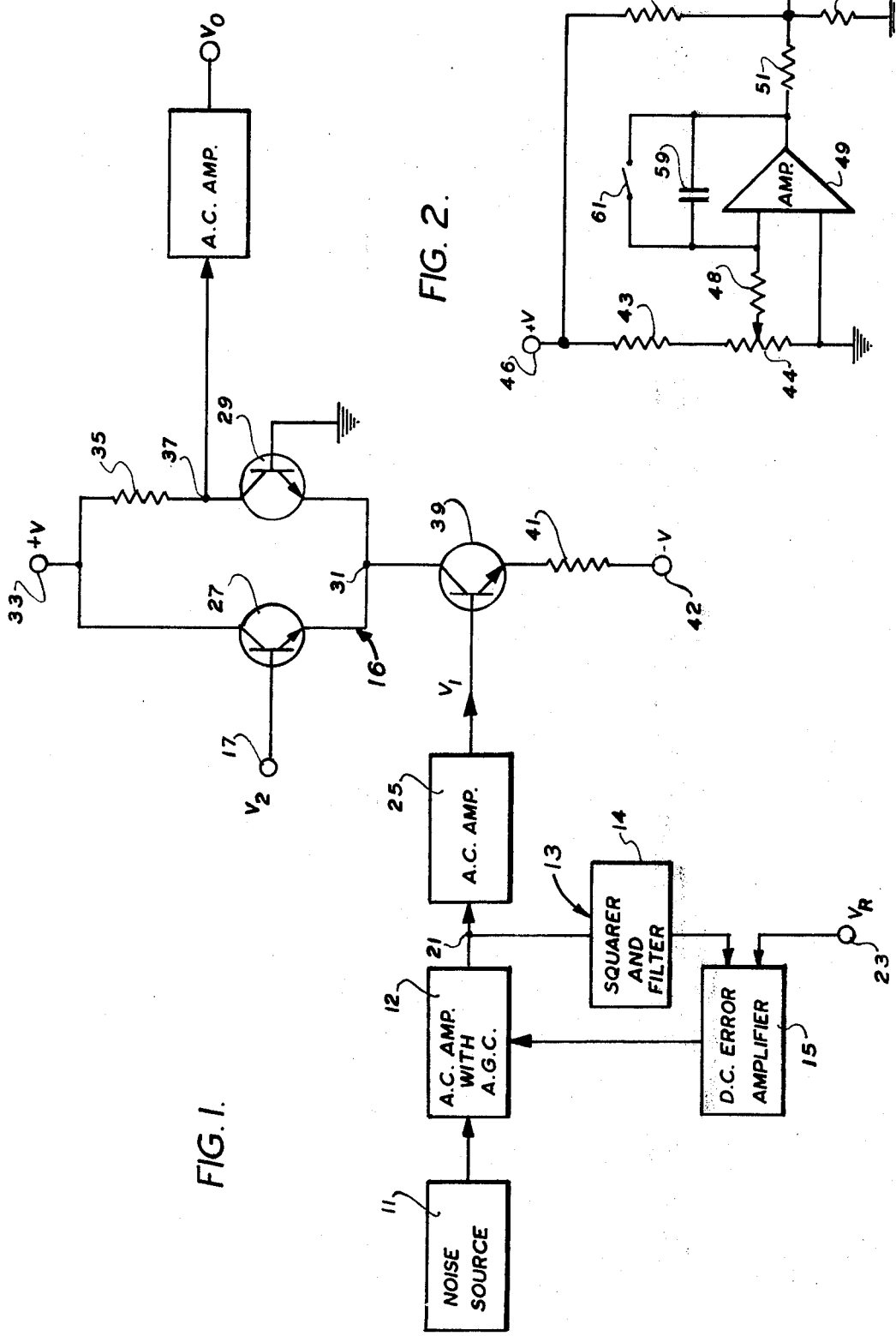

NOISE GENERATOR SYSTEM HAVING AMPLITUDE CONTROL

This invention relates to noise generator systems and, more particularly, to a noise generator system wherein accurate stabilization and time controlled output may be provided.

Noise generator systems utilizing, as input, a random noise source are employed in a wide variety of circumstances. Random noise sources are utilized as test equipment and as operational system components for various applications, such as statistical testing, frequency response testing of circuits and systems, interference testing, electroacoustics measurements, and calibration tests. For example, in the testing and calibration of statistical type channels for neutron flux measurement, it is necessary to simulate the random noise produced by a radiation detector and to stabilize and control this random noise over a wide range.

In many prior art noise generator systems, instability is an inherent problem due to a wide variety of reasons including temperature dependence. For many applications, such as instrumentation, this inherent instability is unsatisfactory. This is especially true where some form of control of the noise signal is desired over a wide dynamic range.

It is an object of the present invention to provide an improved noise generator system.

Another object of the invention is to provide a noise generator system which is inherently stable.

It is another object of the invention to provide a noise generator system wherein the output may be controlled over a wide dynamic range.

It is a further object of the invention to provide an improved noise generator system in which provision is made for amplitude stabilization and time control of the amplitude.

Other objects of the invention will become apparent to those skilled in the art from the following description, taken in connection with the accompanying drawings wherein:

FIG. 1 is a partially schematic, partially block diagram of a noise generator system constructed in accordance with the invention; and FIG. 2 is a schematic diagram of one type of time control circuit which may be used in connection with the system of FIG. 1.

Very generally, the noise generator system of the invention comprises a noise source 11 and amplifier means 12 connected to the noise source and including automatic gain control means responsive to an applied voltage. A feedback loop 13 is coupled between the output of the amplifier means and the input of the automatic gain control means. The feedback loop includes means 14 and 15 for producing a voltage representative of the difference between the output of the amplifier means and a reference voltage. A time controlled output may be provided by the utilization of a differential amplifier 16 which is fed by the stabilized noise signal. A time varying signal is applied to one input 17 of the differential amplifier to provide a time controlled noise output at the output thereof.

Referring now more particularly to FIG. 1, the noise source 11 may be any of a variety of things. For example, the noise source 11 may comprise a resistor made of a semi-conducting material and carrying a current. In any case, the production of random noise signals either from a given set of naturally occurring phenomena or as a generator process is well known.

The output of the noise source 11 is coupled to an a-c amplifier 12. The a-c amplifier has a built-in automatic gain control circuit, as is known in the art, and provides an amplified output of the noise signal from the noise source 11 at the junction 21.

The feedback loop 13 is used to amplitude stabilize the noise source by controlling the gain of the amplifier 12. The feedback loop 13 includes a squarer and filter circuit 14, which may be of any suitable type known in the art. The squarer and filter circuit 14 squares and filters the output from the a-c amplifier 12, providing a d-c output voltage which is proportional to the mean square output of the a-c amplifier 12.

The output of the squarer and filter circuit 14 is applied to the d-c error amplifier 15. The d-c error amplifier may be of any suitable construction known in the art and operates to compare the output of the squarer and filter 14 with a reference d-c voltage $v_R$ provided by the reference voltage source 23. The difference between the output voltage of the squarer and filter 14 and the reference voltage at the source 23 is then amplified by the d-c error amplifier 15 and applied to the automatic gain control circuit of the a-c amplifier 12. The automatic gain control circuit of the a-c amplifier 12 is responsive to a d-c control voltage to regulate the gain of the amplifier. Thus, the output of the amplifier 12 is stabilized to provide a stable amplitude noise signal at the junction 21.

The output voltage of the amplifier 12, which is kept at a constant mean square voltage as a result of the feedback loop 13, is applied to an output a-c amplifier 25. The amplifier 25 may be of any suitable construction to provide drive capability. The amplifier 25 may also provide for amplitude adjustment to produce an output signal whose level can be continuously adjusted.

For certain applications, it is desirable that the noise generator system output be variable in accordance with a specific function or on a time related base. To this end, the differential pair amplifier 16 is used. The amplifier 16 includes a pair of NPN transistors 27 and 29 having their emitters connected to a common junction 31. The collector of the transistor 27 is connected directly to a source 33 of positive voltage, and the collector of the transistor 29 is connected through a resistor 35 to the same source. The junction 37 between the resistor 35 and the collector of the transistor 29 provides the output of the differential pair amplifier 16. The base of the transistor 29 is grounded and the base of the transistor 27 is connected to the input terminal 17 of the differential pair amplifier.

The bias or current source for the differential pair is provided by a transistor 39 which is an NPN transistor having its collector connected to the junction 31 and having its emitter connected through a resistor 41 to a reference negative voltage source 42.

For the differential pair shown in FIG. 1, the output voltage at the junction 37 is equal to the expression:

$$V_{out} = R_c / R_e \; \frac{1}{1 + e^{V_2 / V_T}} V_1$$

Where:
$R_c$ = the resistance of the resistor 35
$R_e$ = the resistance of the resistor 41
$V_2$ = the input voltage to the terminal 17

$V_T = kt/q$, and
$V_1$ = the input voltage to the base of the transistor 39.
If $e^{V_2/V_T} \gg 1$,
then the voltage out is:

$$V_{out} = R_c/R_e \left[ e^{-(V_2/V_T)} \right] V_1$$

Thus, the output of the differential pair amplifier 16 is a function of the input voltage $V_1$ and a function of the voltage $V_2$ at the terminal 17. If the input voltage $V_1$ is the stabilized noise source output and if the voltage $V_2$ applied to the terminal 17 is some time varying signal, the output of the circuit will be a time controlled noise output.

An example of a circuit for applying a signal to the terminal 17 of FIG. 1 which will cause an exponential variation of the output of the amplifier 25 is shown in FIG. 2. Such an exponential variation is useful, for example, in testing and calibrating log mean square nuclear channels for a nuclear reactor. The circuit of FIG. 2 includes a fixed resistor 43 and a variable resistor 44 connected in series between a source 46 of positive voltage and ground. The tap of the resistor 44 is connected through a fixed resistor 48 to the input of a suitable conventional amplifier 49. The output of the amplifier 49 is connected through a fixed resistor 51 to the junction between two fixed resistors 53 and 55. The fixed resistors 53 and 55 are series connected between the positive voltage 46 and ground. The output terminal of the circuit is indicated at 57. A capacitor 59 is connected across the amplifier 49 and is shunted by a switch 61.

The circuit of FIG. 2 produces a negative ramp voltage at the terminal 57 as a result of the capacitor 59 and the resistors 43, 44 and 48. The switch 61 is temporarily closed to start the circuit in production of the negative ramp. The negative ramp produced by the amplifier 49 is summed with a positive d-c off-set by the resistors 51, 53 and 55, indicated as $V_3$. The terminal 57 is connected to the terminal 17 so that $V_3 = V_2$.

The voltage applied by the circuit of FIG. 2 at the terminal 17, $V_2$, is of the form $V_k - \alpha t$. If this expression is substituted into the previous equation set out for $V_o$, the equation becomes:

$$V_o = R_c/R_e \left[ e^{\frac{-V_k}{V_T}} \right] \left[ e^{\frac{\alpha t}{V_T}} \right] V_1 = K e^{\beta t} V_1$$

where $K = R_c/R_e \left[ e^{\frac{-V_k}{V_T}} \right]$ and $\beta = \frac{\alpha}{V_T}$ The above expression indicated that exponential time control over the fixed noise input $V_1$ is produced as a result of connecting the output of the circuit of FIG. 2 to the terminal 17. With voltages other than a d-c shifted ramp such as produced by FIG. 2 applied as the time function control voltage to the terminal 17, a multitude of different time controlled noise outputs is obtainable. In addition, the terminal 23 voltage may be used to provide linear control.

It may, therefore, be seen that the invention provides an improved noise generator system in which amplitude stabilization is achieved by coupling the noise source output to an amplifier, the gain of which is stabilized by a feedback loop that includes a squaring and filtering circuit coupled to the output of the amplifier. After filtering, the feedback signal is coupled to a d-c amplifier which compares the feed back signal with a reference potential. The error voltage thus generated at the output of the d-c amplifier is applied to the noise amplifier to control the gain thereof. Exponential time control of the noise source is achieved by coupling the noise signal into the current source of a differential amplifier and also coupling a ramp voltage to one input of the differential amplifier to produce a noise signal output that grows exponentially with time. Other time related functions are also obtainable with suitable time varying signal inputs.

Various modifications of the invention in addition to those shown and described herein will become apparent to those skilled in the art from the foregoing description and accompanying drawings. Such modifications are intended to fall within the scope of the appended claims.

What is claimed is:

1. A noise generator system comprising, a noise source, amplifier means including automatic gain control means responsive to an applied voltage, means for applying the output of said noise source to the input of said amplifier means, and a feed back loop coupled between the output of said amplifier means and the input of said automatic gain control means, said feed back loop including means for producing a voltage representative of the difference between the output of said amplifier means and a reference voltage.

2. A noise generator system according to Claim 1 wherein said feed back loop includes squaring means for squaring the output of said amplifier means, filter means for producing a d-c voltage from such squared output, and a d-c error amplifier for producing a voltage representative of the difference between the d-c voltage output of said filter means and a reference voltage.

3. A noise generator system according to Claim 1 including a differential pair amplifier, means coupling said amplifier means to bias said differential pair amplifier, and means coupled to one input of said differential pair amplifier for applying a time varying signal thereto to produce a time controlled noise output for said differential pair amplifier.

4. A noise generator system according to Claim 3 including a further a-c amplifier coupled to the output of said differential pair amplifier.

5. A noise generator system according to Claim 3 wherein said time varying signal applying means comprise means for applying a negative ramp voltage to cause the output of said differential pair amplifier to be exponential.

6. A noise generator system comprising, a noise source, amplifier means including automatic gain control means responsive to an applied voltage, means for applying the output of said noise source to the input of said amplifier means, a feed back loop coupled between the output of said amplifier means and the input of said automatic gain control means, said feed back loop including means for producing a voltage representative of the difference between the output of said amplifier means and a reference voltage, a differential pair amplifier, means coupling said amplifier means to bias said differential pair amplifier, and means coupled to one input of said differential pair amplifier for applying a time varying signal thereto to provide a time controlled noise output at the output of said differential pair amplifier.

* * * * *